(12) United States Patent
Chang

(10) Patent No.: US 7,245,179 B2
(45) Date of Patent: Jul. 17, 2007

(54) AUTO GAIN CONTROLLER

(75) Inventor: Chien-Fu Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 210 days.

(21) Appl. No.: 10/956,057

(22) Filed: Oct. 4, 2004

(65) Prior Publication Data

US 2006/0071710 A1    Apr. 6, 2006

(51) Int. Cl.
  *H03F 1/36* (2006.01)
(52) U.S. Cl. .................. 330/86; 330/282; 330/310; 330/278; 250/336.1; 250/206; 250/214 AG
(58) Field of Classification Search ............... 708/823; 330/86, 85, 282, 310, 278; 250/336.1, 206, 250/214 A, 214 AG; 398/202
  See application file for complete search history.

(56) References Cited

U.S. PATENT DOCUMENTS 6,961,746 B1 * 11/2005 Tang ...................... 708/823
2003/0219260 A1 * 11/2003 Chiou et al. ............. 398/202

* cited by examiner

*Primary Examiner*—Michael B Shingleton
(74) *Attorney, Agent, or Firm*—Akin Gump Strauss Hauer & Feld LLP

(57) ABSTRACT

A gain-controlled transimpedance amplifier circuit that comprises a first gain unit including an input for receiving a first current and an output, a current source for providing a second current, a second gain unit including an input and an output, a first impedance unit of a first impedance coupled in parallel with the second gain unit, and a comparator including an output, a first input coupled to the output of the first gain unit, and a second input coupled to the output of the second gain unit.

24 Claims, 3 Drawing Sheets

AUTO GAIN CONTROLLER

FIELD OF THE INVENTION

This invention relates in general to automatic gain control, and more particularly, to a circuit and method for providing automatic gain control for a transimpedance amplifier.

BACKGROUND OF THE INVENTION

A transimpedance amplifier ("TIA") is commonly used to convert an input current signal into an output voltage signal proportional to the input current signal. The input current signal is generally provided by a photo detector such as a photo diode, which converts optical energy transmitted from an optical source into electrical energy in the form of an electrical current. A TIA is often implemented by providing a feedback resistor coupled between an input and an output of an operational amplifier. However, since the optical source may operate in an unstable light environment, the electrical current provided by a photo detector is subject to change as the optical energy changes. As an example, the electrical current may range from 1 microampere to 1 milliampere. Given a resistor of 100 kilo-ohms used in the TIA, the output voltage may range from 1 millivolt to 0.1 volt to 100 volts, which is not acceptable. Moreover, the resistance of a feedback resistor is related to the sensitivity of a TIA. It is generally desirable to use a feedback resistor having a resistance value as great as possible if the bandwidth of the TIA permits. A gain-controlled TIA has been therefore developed to allow a normal gain in response to a normal input current, and a controlled gain in response to an input current that will result in an unacceptable gain region.

FIG. 1 is a schematic diagram of a gain-controlled TIA circuit 10. Referring to FIG. 1, gain-controlled circuit 10 includes an operational amplifier 12, a resistor 14 and an n-channel metal-oxide-semiconductor ("NMOS") transistor 16. Gain-controlled TIA circuit 10 includes an input terminal (not numbered) to receive an input current $I_{IN}$, and an output terminal (not numbered) to provide an output voltage $V_{OUT}$. In operation, in response to a normal input current $I_{IN}$, NMOS transistor 16 is turned off, gain-controlled TIA circuit 10 provides $V_{OUT}$ equal to $-I_{IN} \times R$, where R is the resistance value of resistor 14. When input current $I_{IN}$ exceeds an acceptable region, NMOS transistor 16 turns on, which functions to serve as a variable resistor. Gain-controlled TIA circuit 10 provides $V_{OUT}$ equal to $-I_{IN} \times (R//R')$, where R' is the resistance value of NMOS transistor 16. Gain-controlled TIA circuit 10 therefore provides a gain of R in response to a normal input current, and a gain of R//R' equal to $(R \times R')/(R+R')$ in response to a relatively large input current.

In gain-controlled TIA circuit 10, the variable resistance R' decreases as a drain-to-source current $I_{DS}$ of NMOS transistor 16 increases, which in turn results from an increase in a gate-to-source voltage $V_{GS}$ of NMOS transistor 16. Accordingly, the variable resistance R' decreases as a voltage $V_G$ applied to a gate of NMOS transistor 16 increases. It is important to control the bias voltage $V_G$ in order to provide a controlled gain for TIA circuit 10. An example of a gain-controlled TIA circuit is disclosed in U.S. Pat. No. 6,593,810 (hereinafter the '810 patent) to Yoon, entitled "2.5 Gigabits-per-Second Transimpedance Amplifier." In the '810 patent, a resistor divider network 47 including resistors $R_1$ and $R_2$ is coupled between an output 90 of a replica biasing stage 40 and ground. Resistor divider network 47 provides a scaled output voltage V at a terminal 90 disposed between resistors $R_1$ and $R_2$, which is proportional to a voltage level $V_O$ at output 90 of replica biasing stage 40. The scaled output voltage V is compared with a voltage level at an output 80 of a gain stage 30 to determine whether to turn on a degenerative feedback element 15. However, the voltage level $V_O$ may be deviated due to the loading resistors $R_1$ and $R_2$. As a result, the '810 patent may not provide a fixed scaled output voltage V, which adversely affects the performance of a TIA system.

BRIEF SUMMARY OF THE INVENTION

The present invention is directed to a circuit and a method that obviate one or more problems resulting from the limitations and disadvantages of the prior art.

In accordance with an embodiment of the invention, there is provided a gain-controlled transimpedance amplifier circuit that comprises a first gain unit including an input for receiving a first current and an output, a current source for providing a second current, a second gain unit including an input and an output, a first impedance unit of a first impedance coupled in parallel with the second gain unit, and a comparator including an output, a first input coupled to the output of the first gain unit, and a second input coupled to the output of the second gain unit.

Also in accordance with the present invention, there is provided a gain-controlled transimpedance amplifier circuit that comprises a first gain unit for converting a first current into a first voltage, a first impedance unit providing a first impedance path coupled in parallel with the first gain unit, a second impedance unit providing a second impedance path coupled in parallel with the first gain unit and the first impedance path, a voltage generator for providing a second voltage, and a comparator for activating the second impedance unit when the first voltage is smaller than the second voltage, and deactivating the second impedance unit when the first voltage is greater than the second voltage.

Further in accordance with the present invention, there is provided a method for providing gain control for a transimpedance amplifier that comprises providing a first current, providing a first gain unit to receive the first current, coupling a first impedance unit in parallel with the first gain unit, measuring a first voltage level at an output of the first gain unit when the first current is zero, coupling a second impedance unit in parallel with the first gain unit and the first impedance unit, providing a second current, providing a second unit to receive the second current, coupling a third impedance unit in parallel with the second gain unit, generating a second voltage level at an output of the second gain unit, and activating the second impedance unit when a voltage level at the output of the first gain unit is smaller than the second voltage level.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE DRAWINGS

Reference will now be made in detail to the present embodiment of the invention, an example of which is illustrated in the accompanying drawings. Wherever possible, the same reference numbers are used throughout the drawings to refer to the same or like parts.

DETAILED DESCRIPTION OF THE INVENTION

Figure 1:
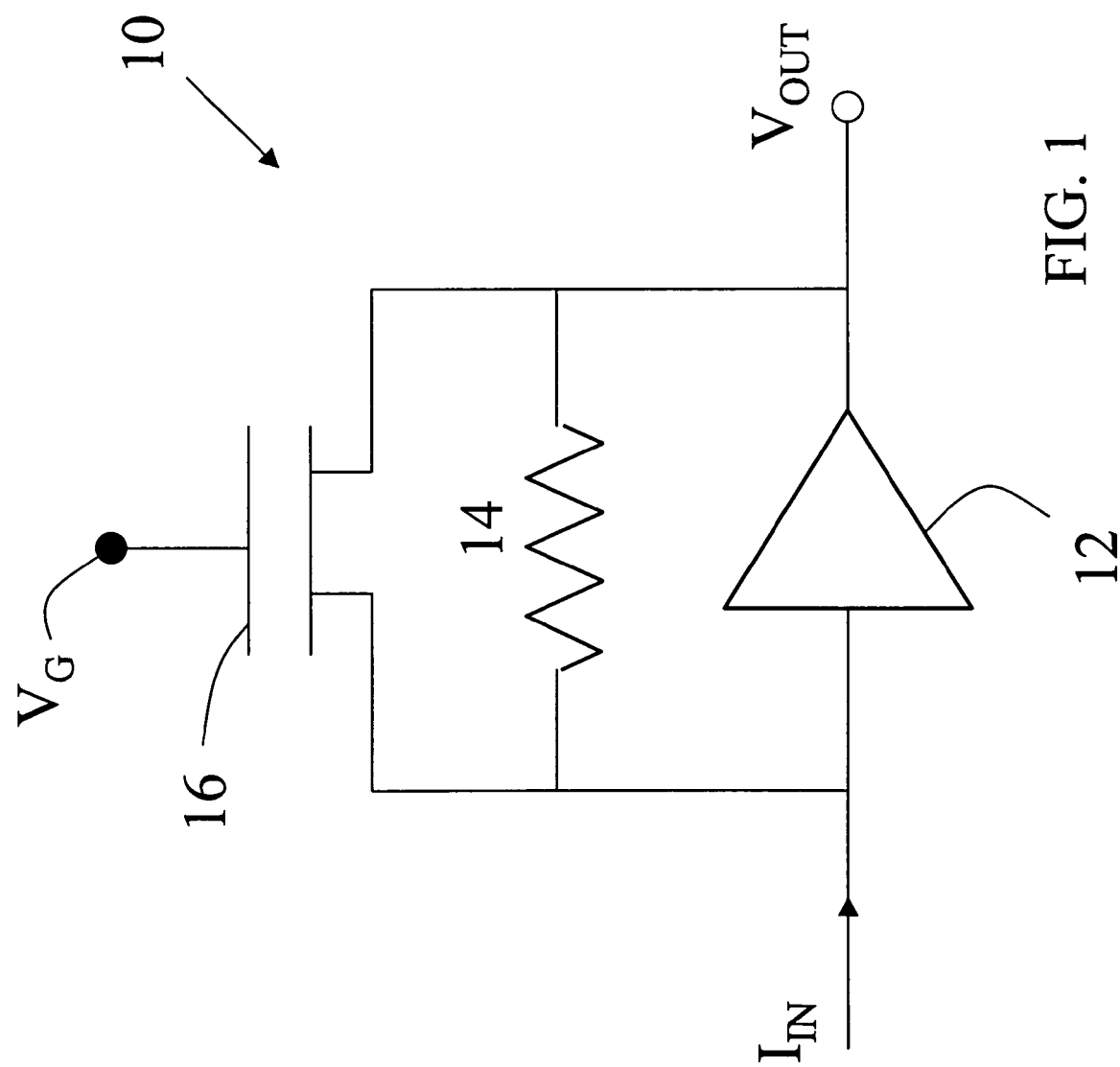
FIG. 1 is a schematic diagram of a gain-controlled transimpedance amplifier ("TIA")
Figure 2:
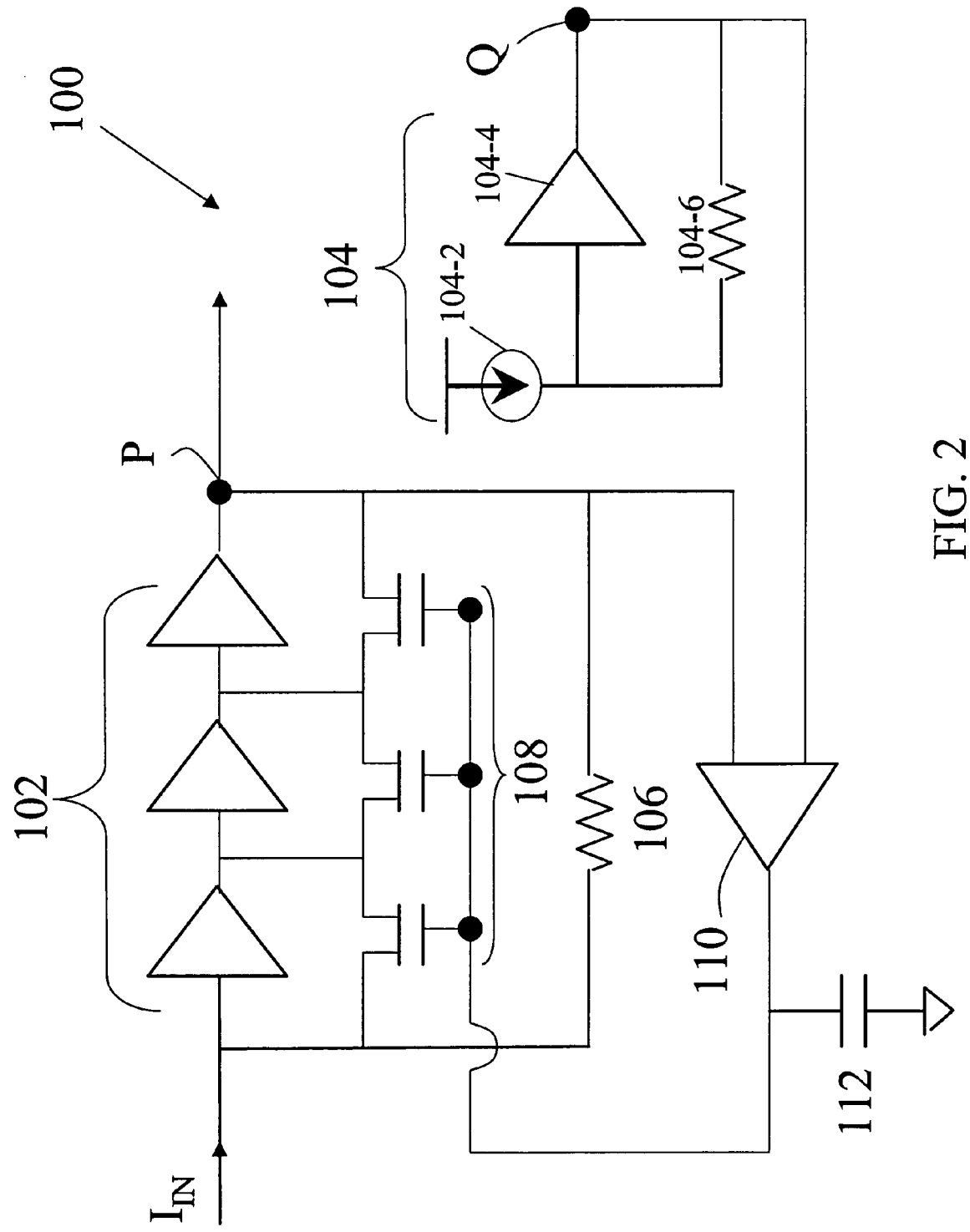
FIG. 2 is a circuit diagram of a gain-controlled TIA circuit in accordance with an embodiment of the present invention.

FIG. 2 is a circuit diagram of a gain-controlled transimpedance amplifier ("TIA") circuit 100 in accordance with an embodiment of the present invention. Referring to FIG. 2, gain-controlled TIA circuit 100 includes a first gain unit 102, a voltage generator 104, a first impedance unit 106, a second impedance unit 108 and a comparator 110. First gain unit 102 receives a current signal $I_{IN}$, which is provided by, for example, a photo detector, and converts the current signal $I_{IN}$ into a voltage signal in conjunction with first impedance unit 106 and second impedance unit 108. In one embodiment according to the invention, first gain unit 102 includes odd-numbered inverter(s). In one aspect, as shown in FIG. 2, three inverters (not numbered) are cascaded to ensure an enough gain output. First impedance unit 106 provides a first impedance path coupled in parallel with first gain unit 102. Second impedance unit 108 provides a second impedance path coupled in parallel with first gain unit 102 and first impedance unit 106. In one embodiment, first impedance unit 106 includes a resistor. Second impedance unit 108 includes odd-numbered transistors. In one aspect, three transistors are gate-connected to each other.

Voltage generator 104 provides a reference voltage, and includes a current source 104-2, a second gain unit 104-4 and a third impedance unit 104-6. Current source 104-2 provides a constant current to second gain unit 104-4. In one embodiment, second gain unit 104-4 includes odd-numbered inverter(s). In one aspect, as shown in FIG. 2, second gain unit 104-4 includes one inverter. Third impedance unit 104-6, for example, a resistor, is coupled in parallel with second gain unit 104-4.

Comparator 110, for example, an operational amplifier, includes a first input (not numbered) coupled to an output P of first gain unit 102, a second input (not numbered) coupled to an output Q of second gain unit 104-4. Comparator 110 compares a reference voltage $V_Q$ generated by voltage generator 104 at the output Q and a voltage $V_P$ at the output P to determine whether to activate second impedance unit 108. Gain-controlled TIA circuit 100 further includes a capacitor 112 coupled between an output (not numbered) of comparator 110 and ground for filtering out a high frequency component of the voltage $V_P$. In other embodiments, a low-pass filter (not shown) is coupled between the output P of first gain unit 102 and the first input of comparator 110 to filter the high frequency component.

In the embodiments, first gain unit 102 and second gain unit 104-4 include odd-numbered inverters. The voltage level of $V_P$ decreases as the magnitude of the current signal $I_{IN}$ increases. If the output $V_P$ is greater than the reference voltage $V_Q$, comparator 110 provides a low voltage signal to the gates of second impedance unit 108, which does not turn on the transistors of second impedance unit 108. On the other hand, if the output $V_P$ is smaller than the reference voltage $V_Q$ due to an increase in the magnitude of the current signal $I_{IN}$, comparator 110 provides a high voltage signal to the gates of second impedance unit 108, which turns on the transistors of second impedance unit 108, and activates the second impedance path. A resultant gain of gain-controlled TIA circuit 100 is thereby reduced to an acceptable region by activating the second impedance path coupled in parallel with the first impedance path.

The reference voltage $V_Q$ is established as follows. In accordance with the present invention, a voltage level $V_{Q0}$ measured at the output Q under a zero constant current provided by current source 104-2 is substantially equal to an output voltage $V_{P0}$ measured at the output P under a zero current signal $I_{IN}$. When a positive constant current is applied, $V_Q$ is substantially equal to $V_{Q0}-I \times R$ and in turn equal to $V_{P0}-I \times R$, where I is the magnitude of the constant current of current source 104-2, and R is the resistance of third impedance unit 104-6. Accordingly, the multiplication product of the magnitude I and the resistance R is used to determine whether to activate second impedance unit 108.

Figure 3:
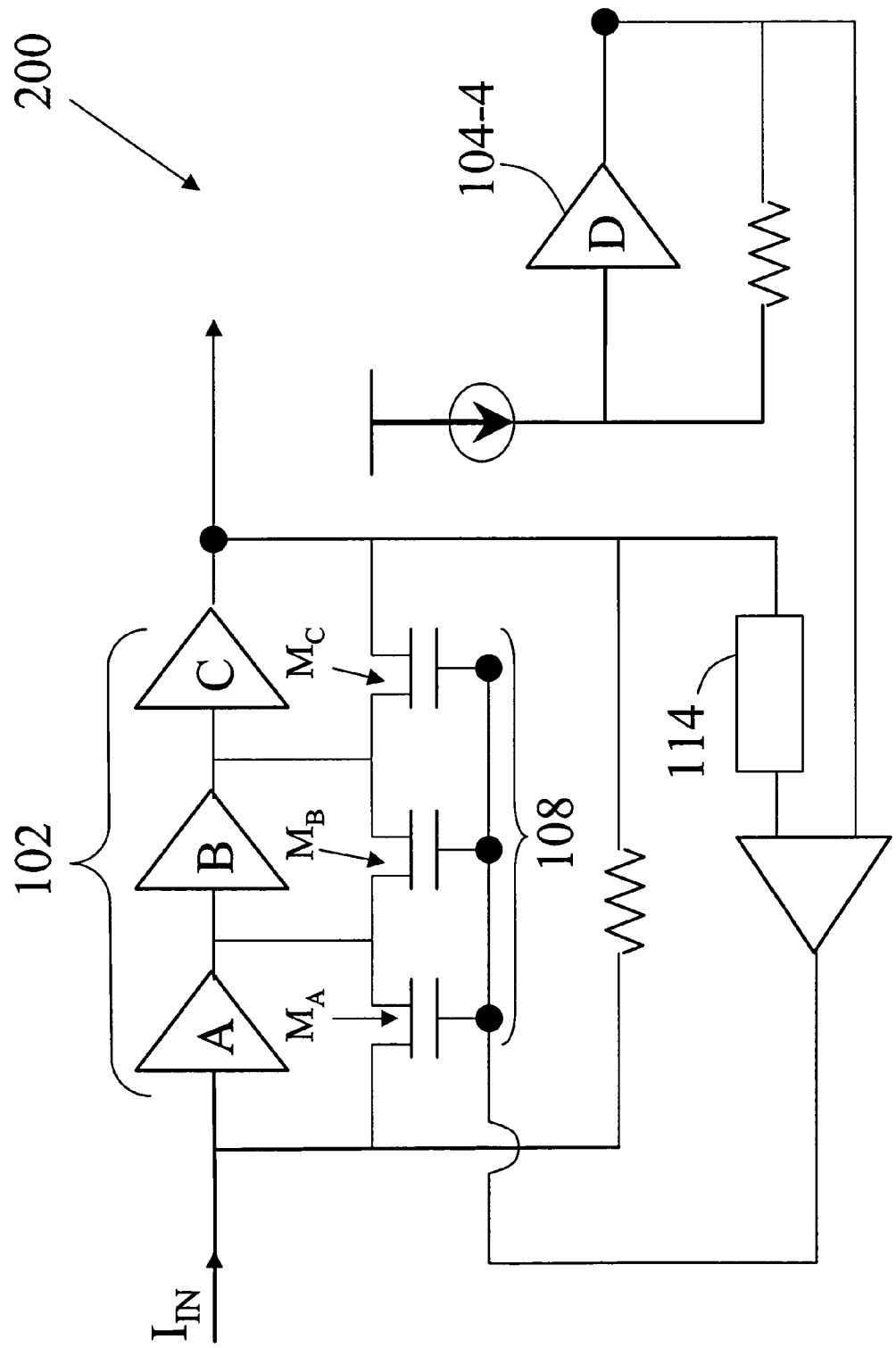
FIG. 3 is a circuit diagram of a gain-controlled TIA circuit in accordance with another embodiment of the present invention.

FIG. 3 is a circuit diagram of a gain-controlled TIA circuit 200 in accordance with another embodiment of the present invention. Gain-controlled TIA circuit 200 is similar to gain-controlled TIA circuit 100 except that a low-pass filter 114 is used to replace capacitor 112 shown in FIG. 2. Referring to FIG. 3, first gain unit 102 includes three inverters labeled with A, B and C. Second gain unit 104-4 includes one inverter labeled with D. In one embodiment, the inverters A, B, C and D are prepared by complementary metal-oxide-semiconductor ("CMOS") techniques. Each of the inverters A, B, C and D includes an n-type MOS ("NMOS") transistor (not shown) and a p-type MOS ("PMOS") transistor. In one aspect, each of the inverters A, B and C of first gain unit 102 has a same $W_P/W_N$ ratio, wherein $W_P$ is a channel width of the PMOS transistor of one of the CMOS inverters, and $W_N$ is a channel width of the NMOS transistor of the CMOS inverter. In another aspect, the inverter D of second gain unit 104-4 has the same $W_P/W_N$ ratio as each of the CMOS inverters A, B and C of first gain unit 102, which ensures that the voltage level $V_{Q0}$ is substantially equal to the output voltage level $V_{P0}$.

Second impedance unit 108 includes three MOS transistors $M_A$, $M_B$ and $M_C$ corresponding to the CMOS inverters A, B, and C of first gain unit 102, respectively. A channel width ratio among the MOS transistors $M_A$, $M_B$ and $M_C$ is equal to an n-channel width ratio among the corresponding NMOS transistors of the CMOS inverters A, B and C, as given below.

$$W_{MA}:W_{MB}:W_{MC}=W_{NA}:W_{NB}:W_{NC}$$

Where $W_{MA}$, $W_{MB}$ and $W_{MC}$ are the channel widths the MOS transistors $M_A$, $M_B$ and $M_C$, respectively, and $W_{NA}$, $W_{NB}$ and $W_{NC}$ are the channel widths of the NMOS transistors of the CMOS inverters A, B and C, respectively.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A gain-controlled transimpedance amplifier circuit, comprising:
   a first gain unit including an input for receiving a first current and an output;
   a current source for providing a second current;
   a second gain unit including an input and an output;
   a first impedance unit of a first impedance coupled in parallel with the second gain unit; and
   a comparator including an output, a first input coupled to the output of the first gain unit, and a second input coupled to the output of the second gain unit,
   wherein a voltage level at the output of the second gain unit is substantially equal to a voltage level at the output of the first gain unit when the first current is zero minus a multiplication product of the magnitude of the second current and the first impedance of the first impedance unit.

2. The circuit of claim 1, further comprising a capacitor coupled between the output of the comparator and ground.

3. A gain-controlled transimpedance amplifier circuit, comprising:
   a first gain unit including an input for receiving a first current and an output;
   a current source for providing a second current;
   a second gain unit including an input and an output;
   a first impedance unit of a first impedance coupled in parallel with the second gain unit;
   a comparator including an output, a first input coupled to the output of the first gain unit, and a second input coupled to the output of the second gain unit; and
   a second impedance unit providing an impedance path coupled in parallel with the first gain unit.

4. The circuit of claim 3, further comprising a third impedance unit coupled in parallel with the first gain unit.

5. The circuit of claim 3, wherein the comparator activates the second impedance unit when the voltage level at the output of the first gain unit is smaller than the voltage level at the output of the second gain unit.

6. The circuit of claim 3, wherein the comparator deactivates the second impedance unit when the voltage level at the output of the first gain unit is greater than the voltage level at the output of the second gain unit.

7. A gain-controlled transimpedance amplifier circuit, comprising:
   a first gain unit including an input for receiving a first current and an output;
   a current source for providing a second current;
   a second gain unit including an input and an output;
   a first impedance unit of a first impedance coupled in parallel with the second gain unit; and
   a comparator including an output, a first input coupled to the output of the first gain unit, and a second input coupled to the output of the second gain unit,
   wherein the first gain unit includes odd-numbered inverters.

8. The circuit of claim 3, wherein the second impedance unit includes odd-numbered transistors.

9. The circuit of claim 1, further comprising a low-pass filter coupled between the first input of the comparator and the output of the first gain unit.

10. A gain-controlled transimpedance amplifier circuit, comprising:
    a first gain unit for converting a first current into a first voltage;
    a first impedance unit providing a first impedance path coupled in parallel with the first gain unit;
    a second impedance unit providing a second impedance path coupled in parallel with the first gain unit and the first impedance path;
    a voltage generator for providing a second voltage; and
    a comparator for activating the second impedance unit when the first voltage is smaller than the second voltage, and deactivating the second impedance unit when the first voltage is greater than the second voltage,
    wherein the voltage generator includes a resistor and a current source providing a second current, the second voltage having a voltage level substantially equal to a voltage level of the first voltage when the first current is zero minus a multiplication product of the magnitude of the second current and the resistance of the resistor.

11. The circuit of claim 10, wherein the voltage generator includes a second gain unit coupled in parallel with the resistor.

12. A gain-controlled transimpedance amplifier circuit, comprising:
    a first gain unit for converting a first current into a first voltage;
    a first impedance unit providing a first impedance path coupled in parallel with the first gain unit;
    a second impedance unit providing a second impedance path coupled in parallel with the first gain unit and the first impedance path;
    a voltage generator for providing a second voltage; and
    a comparator for activating the second impedance unit when the first voltage is smaller than the second voltage, and deactivating the second impedance unit when the first voltage is greater than the second voltage,
    wherein the first gain unit includes odd-numbered inverters.

13. The circuit of claim 12, wherein the second impedance unit includes odd-numbered transistors corresponding to the odd-numbered inverters.

14. The circuit of claim 10, further comprising a capacitor coupled between an output of the comparator and ground.

15. The circuit of claim 10, further comprising a low-pass filter coupled between an input of the comparator and an output of the first gain unit.

16. A gain-controlled transimpedance amplifier circuit, comprising:

a first gain unit for converting a first current into a first voltage;

a first impedance unit providing a first impedance path coupled in parallel with the first gain unit;

a second impedance unit providing a second impedance path coupled in parallel with the first gain unit and the first impedance path;

a voltage generator for providing a second voltage; and a comparator for activating the second impedance unit when the first voltage is smaller than the second voltage, and deactivating the second impedance unit when the first voltage is greater than the second voltage, wherein the first gain unit includes complementary metal-oxide-semiconductor (CMOS) inverters, each of the CMOS inverters having a same $W_P/W_N$ ratio, wherein $W_P$ is a channel width of a p-type MOS (PMOS) transistor of one of the CMOS inverters, and $W_N$ is a channel width of an n-type MOS (NMOS) transistor of the CMOS inverter.

17. The circuit of claim 16, wherein the voltage generator includes a CMOS inverter having the same $W_P/W_N$ ratio as each of the CMOS inverters of the first gain unit.

18. The circuit of claim 16, wherein the second impedance unit includes NMOS transistors corresponding to the CMOS inverters of the first gain unit, and wherein a channel width ratio among the NMOS transistors of the second impedance unit is equal to a channel width ratio among the corresponding NMOS transistors of the CMOS inverters.

19. A method for providing gain control for a transimpedance amplifier, comprising:

providing a first current;

providing a first gain unit to receive the first current;

coupling a first impedance unit in parallel with the first gain unit;

measuring a first voltage level at an output of the first gain unit when the first current is zero;

coupling a second impedance unit in parallel with the first gain unit and the first impedance unit;

providing a second current;

providing a second gain unit to receive the second current;

coupling a third impedance unit in parallel with the second gain unit;

generating a second voltage level at an output of the second gain unit; and activating the second impedance unit when a voltage level at the output of the first gain unit is smaller than the second voltage level.

20. The method of claim 19, wherein the second voltage level is substantially equal to the first voltage level minus a multiplication product of the magnitude of the second current and the impedance of the third impedance unit.

21. The method of claim 19, further comprising deactivating the second impedance unit when a voltage level at the output of the first gain unit is greater than the second voltage level.

22. The method of claim 19, wherein the first gain unit includes complementary metal-oxide-semiconductor (CMOS) inverters, each of the CMOS inverters having a same $W_P/W_N$ ratio, wherein $W_P$ is a channel width of a p-type MOS (PMOS) transistor of one of the CMOS inverters, and $W_N$ is a channel width of an n-type MOS (NMOS) transistor of the CMOS inverter.

23. The method of claim 22, wherein the second gain unit includes a CMOS inverter having the same $W_P/W_N$ ratio as each of the CMOS inverters of the first gain unit.

24. The method of claim 22, wherein the second impedance unit includes NMOS transistors corresponding to the CMOS inverters of the first gain unit, and wherein a channel width ratio among the NMOS transistors of the second impedance unit is equal to a channel width ratio among the corresponding NMOS transistors of the CMOS inverters.

* * * * *